(12) United States Patent
Lin et al.

(10) Patent No.: US 12,069,960 B2
(45) Date of Patent: Aug. 20, 2024

(54) MAGNETIC RANDOM ACCESS MEMORY STRUCTURE

(71) Applicant: UNITED MICROELECTRONICS CORP., Hsin-Chu (TW)

(72) Inventors: Da-Jun Lin, Kaohsiung (TW); Ching-Hua Hsu, Kaohsiung (TW); Fu-Yu Tsai, Tainan (TW); Bin-Siang Tsai, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 334 days.

(21) Appl. No.: 17/376,179

(22) Filed: Jul. 15, 2021

(65) Prior Publication Data
US 2022/0406994 A1 Dec. 22, 2022

(30) Foreign Application Priority Data

Jun. 18, 2021 (CN) .......................... 202110678446.X

(51) Int. Cl.
*H10N 50/10* (2023.01)
*H10B 61/00* (2023.01)
*H10N 50/01* (2023.01)
*H10N 50/80* (2023.01)

(52) U.S. Cl.
CPC ............. *H10N 50/10* (2023.02); *H10B 61/00* (2023.02); *H10N 50/01* (2023.02); *H10N 50/80* (2023.02)

(58) Field of Classification Search
CPC ........ H10N 50/10; H10N 59/00; H10N 50/80; H10N 50/01; H10N 50/00–85; H01L 25/16; H01L 2224/03011; B81C 1/00563; B81C 1/00587; H10K 59/88; Y10S 438/926; G11C 7/227; G11C 2213/34; H10B 61/00–22
See application file for complete search history.

(56) References Cited

U.S. PATENT DOCUMENTS 9,343,659 B1 * 5/2016 Lu .......................... H10N 50/10
9,419,139 B2 * 8/2016 Wu ................... H01L 21/02167
9,818,935 B2 11/2017 Chuang
(Continued)

OTHER PUBLICATIONS

Mitchell, Robin. Meet Amorphous Boron Nitride—The Future Dielectric. Jul. 22, 2020. URL: https://www.electropages.com/blog/2020/07/meet-amorphous-boron-nitride-future-dielectric#:~:text=The%20material%2C%20known%20as%20Amorphous,by%20near%2Dby%20electrical%20conductors. (Year: 2020).*

(Continued)

*Primary Examiner* — Steven M Christopher
*Assistant Examiner* — Tyler J Wiegand
(74) *Attorney, Agent, or Firm* — Winston Hsu

(57) ABSTRACT

The invention provides a semiconductor structure, the semiconductor structure includes a dielectric layer, a plurality of MTJ stacked elements and at least one dummy MTJ stacked element located in the dielectric layer, a first nitride layer covering at least the sidewalls of the MTJ stacked elements and the dummy MTJ stacked elements, a second nitride layer covering the top surfaces of the dummy MTJ stacked elements, the thickness of the second nitride layer is greater than the thickness of the first nitride layer, and a plurality of contact structures located in the dielectric layer and electrically connected with each MTJ stacked element.

16 Claims, 3 Drawing Sheets

(56) References Cited

U.S. PATENT DOCUMENTS

2019/0206928 A1* 7/2019 Li ............................ H10N 50/80
2021/0091306 A1* 3/2021 Dutta ...................... H10N 50/01

OTHER PUBLICATIONS

Maciel N, Marques E, Naviner L, Zhou Y, Cai H. Magnetic Tunnel Junction Applications. Sensors (Basel). Dec. 24, 2019;20(1): 121. doi: 10.3390/s20010121. PMID: 31878139; PMCID: PMC6982960. (Year: 2019).*

* cited by examiner

MAGNETIC RANDOM ACCESS MEMORY STRUCTURE

BACKGROUND OF THE INVENTION

1. Field of the Invention

The present invention relates to the technical field of semiconductors, in particular to a magnetic tunnel junction (MTJ) structure of a magnetic random access memory (MRAM).

2. Description of the Prior Art

MRAM is a nonvolatile memory technology that uses magnetization to represent stored data. Generally, MRAM includes a plurality of magnetic cells in an array. Each cell typically represents one bit of data. Included in the cells are magnetic elements. A magnetic element may include two ferromagnetic "plates" (or layers upon a semiconductor substrate) each of which has a magnetization direction (or orientation of magnetic moments) associated with it. The two ferromagnetic plates are separated by a thin non-magnetic layer.

More specifically, a MRAM element is often based on a magnetic tunnel junction (MTJ) device. An MTJ device includes at least three basic layers: a "free layer," a tunneling barrier layer, and a "fixed layer." The free layer and the fixed layer are ferromagnetic layers. The tunneling barrier layer is a thin insulator layer located between the free layer and the fixed layer. The magnetization direction of the free layer is free to rotate, but is constrained by the physical size of the layer to point in either of two directions; the magnetization of the fixed layer is fixed in a particular direction. A bit is written to the MTJ device by orienting the magnetization direction of the free layer in one of the two directions. Depending upon the orientations of the magnetic moments of the free layer and the fixed layer, the resistance of the MTJ device will change. Thus, the bit may be read by determining the resistance of the MTJ device. When the magnetization direction of the free layer and the fixed layer are parallel and the magnetic moments have the same polarity, the resistance of the MTJ device is low. Typically, this is designated a "0." When the magnetization direction of the free layer and the fixed layer are anti-parallel and the magnetic moments have the opposite polarity, the resistance of the MTJ is high. Typically, this is designated a "1."

SUMMARY OF THE INVENTION

The invention provides a semiconductor structure, which comprises a dielectric layer, a plurality of MTJ stacked elements and at least one dummy MTJ stacked element located in the dielectric layer, a first nitride layer covering at least the sidewalls of the MTJ stacked elements and the dummy MTJ stacked elements, a second nitride layer covering the top surfaces of the dummy MTJ stacked elements, wherein the thickness of the second nitride layer is greater than that of the first nitride layer, and a plurality of contact structures located in the dielectric layer and electrically connected with each MTJ The invention also provides a manufacturing method of a semiconductor structure, which comprises providing a dielectric layer, forming a plurality of MTJ stacked elements and at least one dummy MTJ stacked element in the dielectric layer, forming a first nitride layer covering at least the sidewalls of each MTJ stacked element and the dummy MTJ stacked element, forming a second nitride layer covering the top surface of each dummy MTJ stacked element, wherein the thickness of the second nitride layer is greater than that of the first nitride layer, and forming a plurality of contact structures in the dielectric layer, and The feature of the present invention is to provide a semiconductor structure including MTJ stacked elements and a manufacturing method thereof. In the process of forming semiconductor elements, a mask consisting of a first nitride layer and a second nitride layer is formed on the top of each MTJ stacked element, so that the protection effect on the top of the MTJ stacked element can be enhanced, and the contact structure can be prevented from excessively entering the MTJ stacked element and affecting its performance when the contact structure is formed. At the same time, in the area where other contact structures (e.g., the contact structure connecting the source line) are scheduled to be formed next to the dummy MTJ stacked element, only the first nitride layer is formed, and the second nitride layer is not formed, so that the contact structure can easily penetrate through the dielectric layer (e.g., the oxide layer) and the first nitride layer and be electrically connected with other wires.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
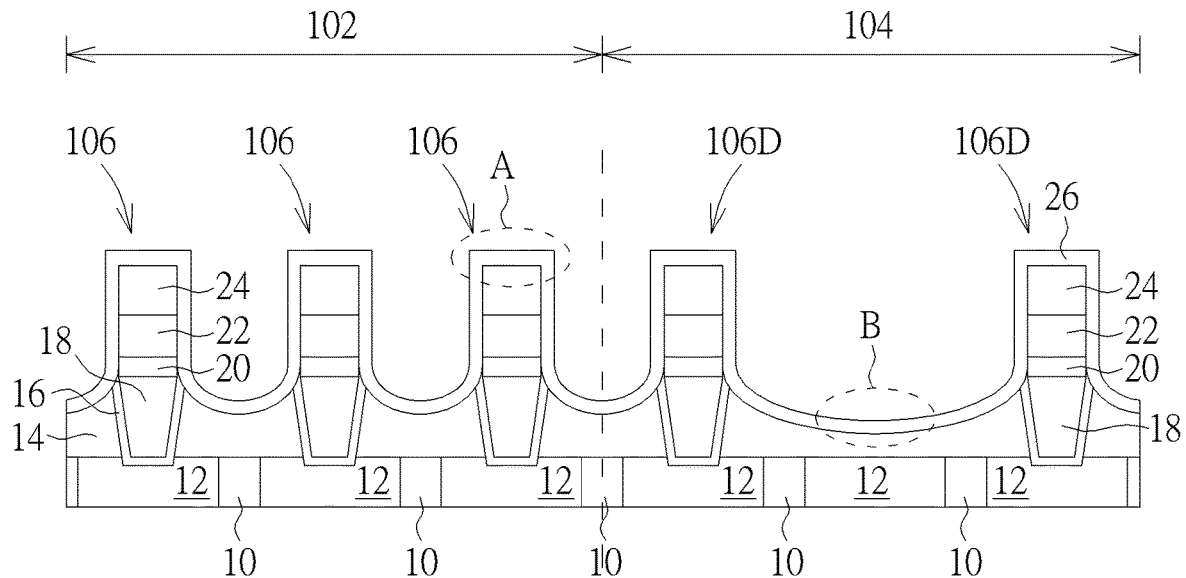
FIG. 1 to FIG. 6 show schematic cross-sectional views of semiconductor structures including MTJ stacked elements fabricated by the present invention.

FIG. 1 to FIG. 6 show schematic cross-sectional views of semiconductor structures including a MTJ stacked elements fabricated by the present invention. As shown in FIG. 1, first, a dielectric layer 10 is provided, on which an cell region 102 and a peripheral region 104 are defined, in which a plurality of MTJ stacked elements 106 are formed in the cell region 102, and the peripheral region 104 is located next to the cell region 102. Usually, no elements are formed in the peripheral region 104, Or dummy elements are formed as buffers to avoid various problems caused by excessive difference in device density at the boundary between the device area 102 and the peripheral area 104.

The dielectric layer 10 is, for example, one of the dielectric layers in a memory device, and the dielectric layer 10 contains wires 12, which may be electrically connected to other lower electronic devices (such as transistors, etc.), which are not depicted here for the sake of simplicity of the drawing. In addition, a plurality of MTJ stacked elements 106 are included in the cell region 102 and a plurality of dummy MTJ stacked elements 106D are included in the peripheral region 104, the MTJ stacked elements 106 and the dummy MTJ stacked elements 106D have substantially the same structure, but in the subsequent steps, the MTJ stacked elements 106 will be electrically connected with other electronic elements and used as operating elements, while the dummy MTJ stack element 106D is usually not electrically connected with other electronic elements, and the dummy MTJ stack element 106D is usually located at the boundary between the cell region 102 and the peripheral region 104.

In this embodiment, the MTJ stacked element 106 and the dummy MTJ stacked element 106D are located in an oxide layer 14, and the MTJ stacked element 106 and the dummy MTJ stacked element 106D sequentially include a bottom liner layer 16, a bottom contact structure 18, a lower electrode 20, a MTJ main structure 22, and an upper electrode 24 from bottom to top. And further includes a first nitride layer 26 covering the top surface and sidewalls of each MTJ stacked element 106 and the dummy MTJ stacked element 106D.

In this embodiment, the wire 12 is made of copper (Cu), the oxide layer 14 is made of silicon oxide, the bottom liner layer 16 is made of titanium nitride (TiN), the bottom contact structure 18 is made of tungsten (W), the lower electrode 20 and the upper electrode 24 are made of conductive materials such as titanium, tantalum nitride (TaN) and titanium nitride (TiN). The MTJ main structure 22 includes a pin layer, a resistance conversion layer and a free layer, wherein both the pin layer and the free layer can be ferromagnetic metals, such as CoFe, CoFe, NiFe, etc., and the resistance conversion layer is made of Cr, Ru, TiN, Ti, Ta, TaN, Al, Mg or oxides such as MgO. The material of the first nitride layer 26 is silicon nitride, for example. It is worth noting that the materials of the above elements are only examples of the present invention, and the present invention is not limited to this. The MTJ stacked element 106 and the dummy MTJ stacked element 106D are formed by stacking the above-mentioned material layers. Since the related principles of the MTJ stacked element belong to the conventional technology in the field, they are not described in detail here.

It is worth noting that in the subsequent steps, a contact structure (not shown) will be formed. Some of the contact structure is electrically connected to the top of the MTJ stacked element 106 (such as the region A in FIG. 1), and other contact structures penetrate through the first nitride layer 26 and the oxide layer 14 (such as the region B shown in FIG. 1) and is electrically connected to the underlying wire 12. The applicant's experimental results show that because the location of the region A is higher than that of the region B, it is easier for the region A to be etched through while the region B is less likely to be etched through when forming the contact structure. However, in the current structure, both the region A and the region B are covered by the first nitride layer 26. Therefore, whether the region A and the region B are etched through depends on the thickness of the first nitride layer 26. If the thickness of the first nitride layer 26 is too thick, it may lead to the problem that the region B is not easily etched through. On the contrary, if the thickness of the first nitride layer 26 is too thin, it may lead to the problem that the region A is etched through prematurely.

Therefore, in order to solve the above problems, another nitride layer mask is additionally formed on the top of each MTJ stacked element 106 and the dummy MTJ stacked element 106D, so as to increase the protection ability of the top of the MTJ stacked element 106 and the dummy MTJ stacked element 106D, and to avoid over-etching the region A to affect the MTJ stacked element below in the etching process. See the following paragraphs for details.

Figure 2:
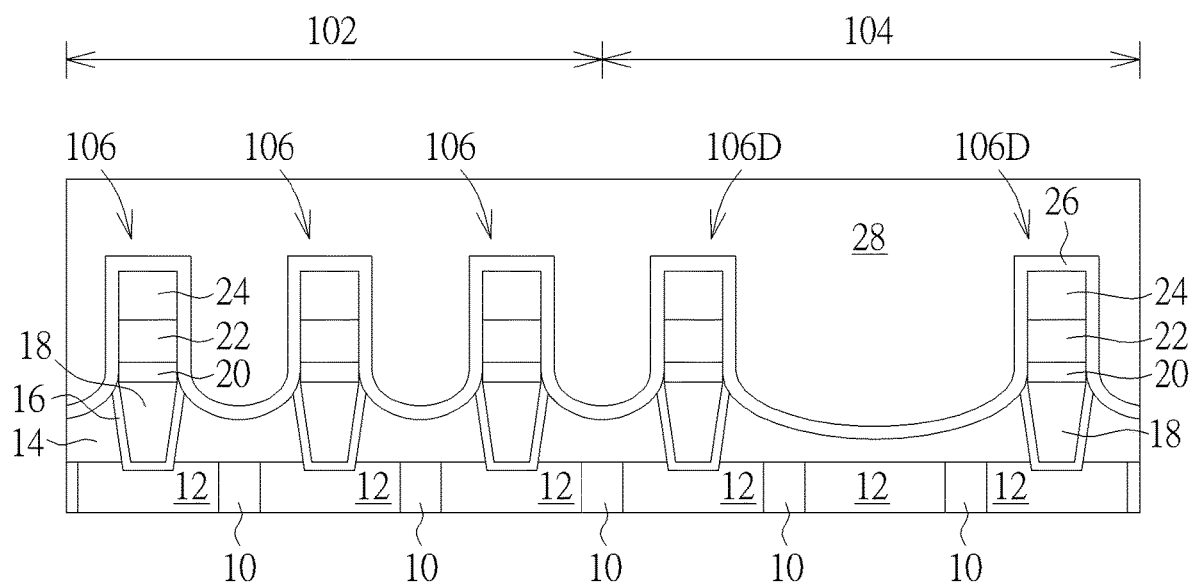
Figure 3:
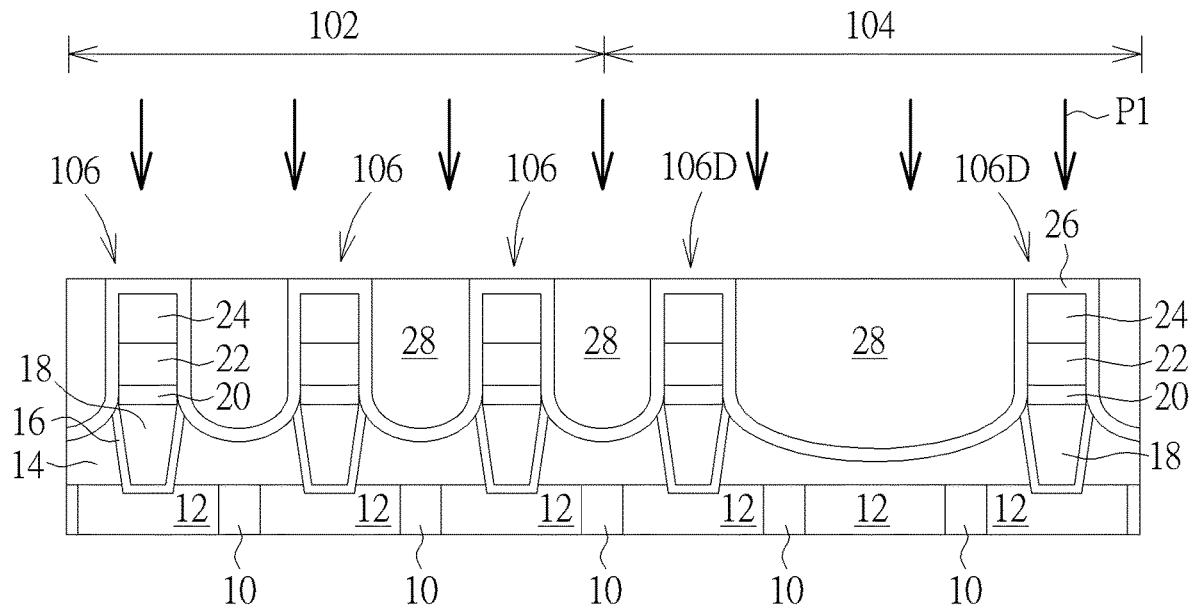

Please continue to refer to FIG. 2 to FIG. 5. At first, as shown in FIG. 2, a dielectric layer 28 is formed to cover each MTJ stacked element 106 and dummy MTJ stacked element 106D, and then, as shown in FIG. 3, an etch-back step P1 is performed to reduce the height of the dielectric layer 28 and expose the top surface of the first nitride layer 26. The dielectric layer 28 described here is, for example, silicon oxide, but is not limited thereto.

Figure 4:
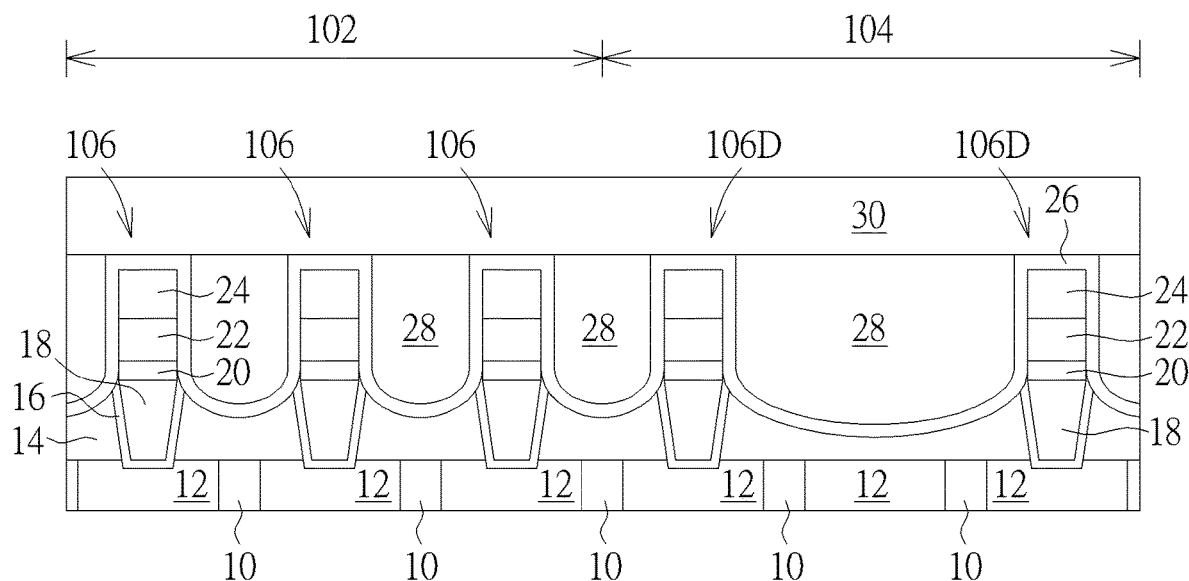
Figure 5:
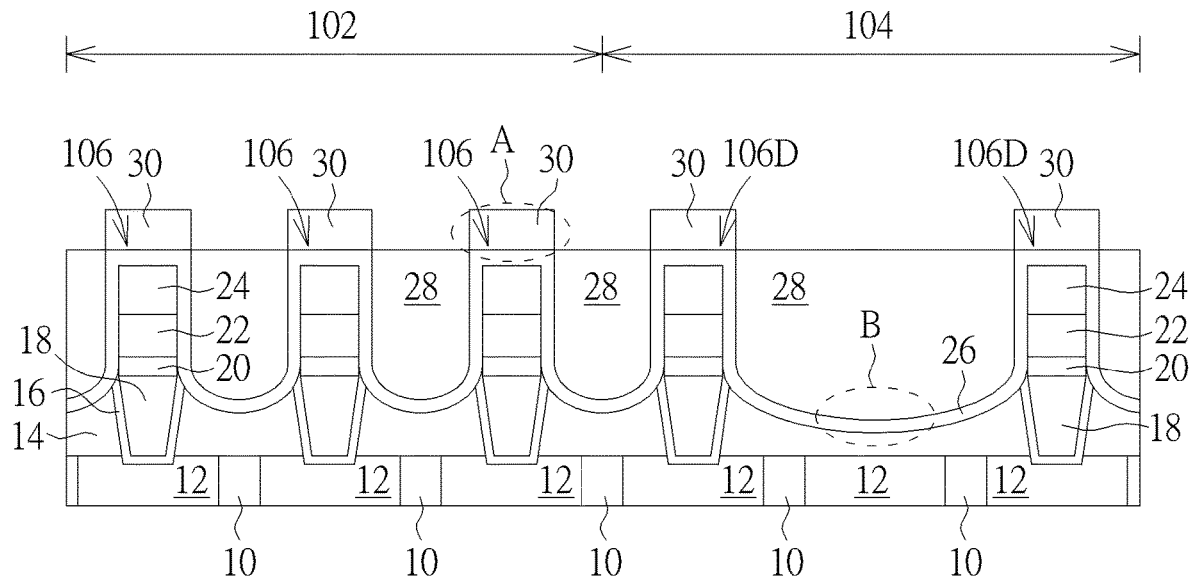

As shown in FIG. 4, a second nitride layer 30 is formed to cover the top surfaces of the dielectric layer 28 and the first nitride layer 26. In this embodiment, the thickness of the second nitride layer 30 is greater than that of the first nitride layer 26. Then, as shown in FIG. 5, a patterning step is performed to remove part of the second nitride layer 30. The material of the second nitride layer 30 is, for example, silicon nitride, and the patterning step includes, for example, a photolithography etching step. It is worth noting that the mask used in the lithography etching step may be the same as the mask used in forming the MTJ stacked element 106 and the dummy MTJ stacked element 106D. Therefore, the remaining second nitride layer 30 will have the same pattern as the MTJ stacked element 106 and the dummy MTJ stacked element 106D, and completely protect the top surfaces of each MTJ stacked element 106 and the dummy MTJ stacked element 106D. Therefore, the second nitride layer 30 is formed without using an additional mask.

It is worth noting that until the step shown in FIG. 5, the second nitride layer 30 has been formed on the top of each MTJ stacked element 106 and the dummy MTJ stacked element 106D (corresponding to the region A in FIG. 1), so in the subsequent etching step, the region A is less likely to be over-etched to affect the MTJ stacked element below. Meanwhile, the second nitride layer 30 is not additionally formed in the region B, so the etching of the region B will not be affected.

Figure 6:
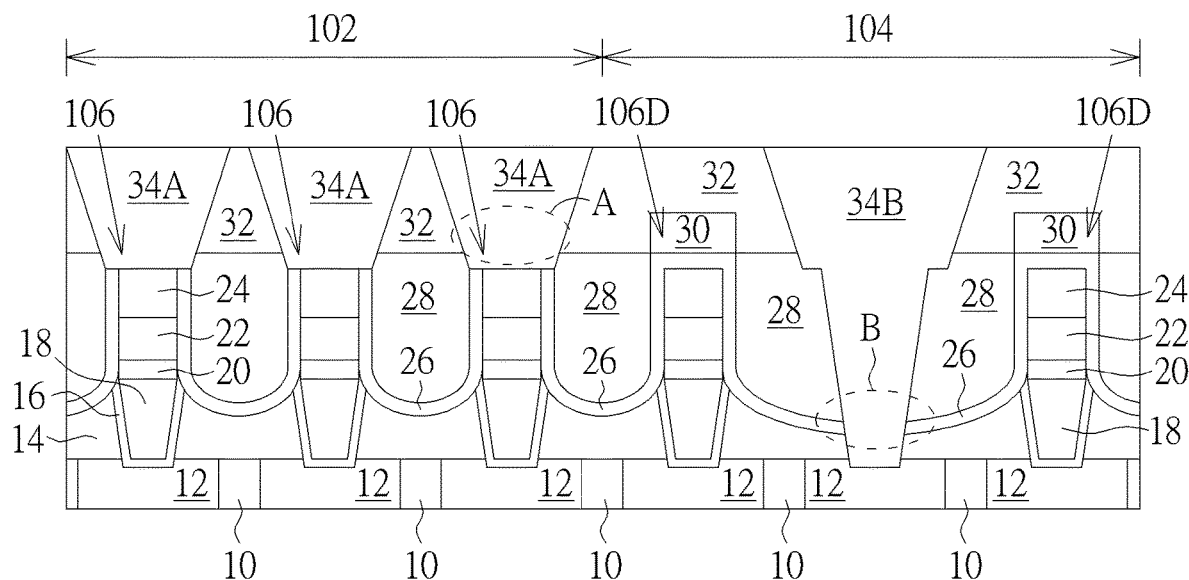

Then, as shown in FIG. 6, another dielectric layer 32 is formed to cover the dielectric layer 28, and contact structures 34A and 34B are formed in the dielectric layer 32 by etching and filling the metal layer. The contact structure 34A penetrates through the dielectric layer 32, the second nitride layer 30 and the first nitride layer 26 and is electrically connected with the MTJ stacked element 106, while the contact structure 34B penetrates through the dielectric layer 32, the dielectric layer 28, the first nitride layer 26 and the oxide layer 14 and is electrically connected with the underlying conductive line 12. Here, the contact structure 34B can be electrically connected to elements such as a source line (SL), for example. In addition, it is worth noting that no contact structure is formed above the dummy MTJ stacked element 106D, so the second nitride layer 30 and the first nitride layer 26 still cover the top surface of the dummy MTJ stacked element 106D. However, since the contact structure 34A has been formed on the top of the MTJ stacked element 106, so the first nitride layer 26 does not cover the top of the MTJ stacked element 106 at this time.

According to the above description and drawings, the present invention provides a semiconductor structure including a dielectric layer 28, a plurality of MTJ stacked elements 106 and at least one dummy MTJ stacked element 106D located in the dielectric layer 28, a first nitride layer 26 covering at least the sidewalls of each MTJ stacked element 106 and the dummy MTJ stacked element 106D, and a second nitride layer 30 covering the top surface of each dummy MTJ stacked element 106. And the thickness of the second nitride layer 30 is greater than that of the first nitride layer 26, and a plurality of contact structures 34A are located in the dielectric layer 28 and electrically connected with each MTJ stacked element 106.

In some embodiments of the present invention, the second nitride layer 30 covers the top surface of the dummy MTJ stacked element 106D, and a part of the top surface of the dielectric layer 28 is not covered by the second nitride layer 30.

In some embodiments of the present invention, at least another contact structure 34B penetrates through the dielectric layer 28, and the contact structure 34B is located beside the dummy MTJ stacked element 106D.

In some embodiments of the present invention, another contact structure 34B penetrating through the dielectric layer 28 is electrically connected to a wire 12 under the dielectric layer 28.

In some embodiments of the present invention, the MTJ stacked element 106 includes an upper electrode 24, a lower electrode 20 and an intermediate MTJ main structure 22.

In some embodiments of the present invention, the MTJ stacked element 106 is connected to another wire structure 12 under the dielectric layer 28.

In some embodiments of the present invention, an oxide layer 14 is further included, which is located under the first nitride layer 26, and the oxide layer 14 includes an arc-shaped concave surface (as shown in the region B in FIG. 1).

In some embodiments of the present invention, a first nitride layer 26 covers both the top surface of each dummy MTJ stacked element 106D and the arc-shaped concave surface of the oxide layer 14, but does not cover the top surface of each MTJ stacked element 106.

In addition, the present invention provides a manufacturing method of semiconductor structure, including providing a dielectric layer 28, forming a plurality of MTJ stacked elements 106 and at least one dummy MTJ stacked element 106D in the dielectric layer 28, forming a first nitride layer 26 covering at least the sidewalls of each MTJ stacked element 106 and dummy MTJ stacked element 106D, forming a second nitride layer 30 covering the top surface of each dummy MTJ stacked element 106D, And the thickness of the second nitride layer 30 is greater than that of the first nitride layer 26, and a plurality of contact structures 34A are formed in the dielectric layer 28 and electrically connected with each MTJ stacked element 106.

In some embodiments of the present invention, an oxide layer 14 is formed under the first nitride layer 26, and the oxide layer 14 includes an arc-shaped concave surface.

The feature of the present invention is to provide a semiconductor structure including MTJ stacked elements and its manufacturing method. In the process of forming semiconductor elements, a mask consisting of two layers of first nitride layer and second nitride layer is formed on the top of each MTJ stacked element, so that the protection effect on the top of MTJ stacked elements can be enhanced, and the contact elements can be prevented from excessively penetrating into MTJ stacked elements and affecting their performance when forming contact structures. At the same time, in the area where other contact structures (e.g., contact structures connecting source lines) are scheduled to be formed next to the dummy MTJ stacked element, only the first nitride layer is formed without the second nitride layer, so that the contact structure can easily penetrate through the dielectric layer (e.g., oxide layer) and the first nitride layer and be electrically connected with other wires.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a dielectric layer;
   a plurality of MTJ stacked elements and at least one dummy MTJ stacked element are located in the dielectric layer;
   a first nitride layer covering at least the sidewalls of each MTJ stacked element and the sidewalls of each dummy MTJ stacked element, wherein the first nitride layer is a single layer structure, and the first nitride layer is made of silicon nitride;
   a second nitride layer covering the top surface of each dummy MTJ stacked element, and the thickness of the second nitride layer is greater than the thickness of the first nitride layer, wherein the first nitride layer contacts the second nitride layer directly, and wherein the second nitride layer is a single layer structure, and the second nitride layer is made of silicon nitride; and
   a plurality of contact structures located in the dielectric layer and electrically connected with each MTJ stacked element, wherein the second nitride layer does not contact each contact structure directly.

2. The semiconductor structure according to claim 1, wherein the second nitride layer covers the top surface of each dummy MTJ stacked element, and a part of the top surface of the dielectric layer is not covered by the second nitride layer.

3. The semiconductor structure according to claim 1, wherein at least a contact structure penetrates through the dielectric layer, and the contact structure is located beside each dummy MTJ stacked element.

4. The semiconductor structure according to claim 3, wherein the contact structure penetrating through the dielectric layer is electrically connected to a wire under the dielectric layer.

5. The semiconductor structure according to claim 1, wherein each MTJ stacked element comprises an upper electrode, a lower electrode and an intermediate MTJ main structure.

6. The semiconductor structure according to claim 1, wherein each MTJ stacked element is connected to a wire structure below the dielectric layer.

7. The semiconductor structure according to claim 1, further comprising an oxide layer under the first nitride layer, and the oxide layer comprises an arc-shaped concave surface.

8. The semiconductor structure according to claim 7, wherein the first nitride layer covers both the top surface of each dummy MTJ stacked element and the arc-shaped concave surface of the oxide layer, but does not cover the top surface of each MTJ stacked element.

9. A manufacturing method of a semiconductor structure, comprising:
   providing a dielectric layer;
   forming a plurality of MTJ stacked elements and at least one dummy MTJ stacked element in the dielectric layer;

forming a first nitride layer, at least covering the sidewalls of each MTJ stacked element and the sidewalls of each dummy MTJ stacked element, wherein the first nitride layer is a single layer structure, and the first nitride layer is made of silicon nitride;

forming a second nitride layer covering the top surface of each dummy MTJ stacked element, and the thickness of the second nitride layer is greater than the thickness of the first nitride layer, wherein the first nitride layer contacts the second nitride layer directly, and wherein the second nitride layer is a single layer structure, and the second nitride layer is made of silicon nitride; and forming a plurality of contact structures located in the dielectric layer and electrically connected with each MTJ stacked element, wherein the second nitride layer does not contact each contact structure directly.

10. The method according to claim 9, wherein the second nitride layer covers the top surface of each dummy MTJ stacked element, and a part of the top surface of the dielectric layer is not covered by the second nitride layer.

11. The method according to claim 9, wherein at least a contact structure penetrates through the dielectric layer, and the contact structure is located beside each dummy MTJ stacked element.

12. The method according to claim 11, wherein the contact structure penetrating through the dielectric layer is electrically connected to another wire under the dielectric layer.

13. The method according to claim 9, wherein each MTJ stacked element comprises an upper electrode, a lower electrode and an intermediate MTJ main structure.

14. The method according to claim 9, wherein each MTJ stacked element is connected to a wire structure under the dielectric layer.

15. The method according to claim 9, further comprising forming an oxide layer under the first nitride layer, and the oxide layer comprises an arc-shaped concave surface.

16. The method according to claim 15, wherein the first nitride layer covers both the top surface of each dummy MTJ stacked element and the arc-shaped concave surface of the oxide layer, but does not cover the top surface of each MTJ stacked element.

* * * * *